(12) United States Patent
Cheng et al.

(10) Patent No.: US 8,035,038 B2
(45) Date of Patent: Oct. 11, 2011

(54) METHOD FOR FABRICATING A PRINTED CIRCUIT BOARD HAVING A COAXIAL VIA

(75) Inventors: Wheling Cheng, Palo Alto, CA (US); Roger Karam, Mountain View, CA (US); Sergio Camerlo, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 262 days.

(21) Appl. No.: 12/101,426

(22) Filed: Apr. 11, 2008

(65) Prior Publication Data

US 2008/0185180 A1    Aug. 7, 2008

Related U.S. Application Data

(62) Division of application No. 11/292,536, filed on Dec. 2, 2005, now Pat. No. 7,404,250.

(51) Int. Cl.
*H05K 1/11* (2006.01)
(52) U.S. Cl. .......................................... 174/266; 361/792
(58) Field of Classification Search .......... 174/262–266; 361/792–795
See application file for complete search history.

(56) References Cited

U.S. PATENT DOCUMENTS

| | | | |
|---|---|---|---|
| 5,876,842 A * | 3/1999 | Duffy et al. | 428/209 |
| 5,898,991 A | 5/1999 | Fogel et al. | |
| 5,949,030 A * | 9/1999 | Fasano et al. | 174/262 |
| 6,479,764 B1 | 11/2002 | Frana et al. | |
| 6,937,120 B2 * | 8/2005 | Fisher et al. | 333/246 |
| 2004/0069529 A1 | 4/2004 | Oggioni et al. | |
| 2004/0212971 A1 | 10/2004 | Iguchi | |
| 2005/0146049 A1 * | 7/2005 | Kripesh et al. | 257/776 |
| 2007/0001299 A1 * | 1/2007 | Kikuchi et al. | 257/723 |

OTHER PUBLICATIONS

Translation of Office Action dated Dec. 11, 2009 from the State Intellectual Property Office of the People's Republic of China for Chinese Patent Application No. 200680043847.1.
International Search Report and Written Opinion of PCT Application Serial No. PCT/US06/61550 dated Oct. 4, 2007.

* cited by examiner

*Primary Examiner* — Jeremy C Norris
(74) *Attorney, Agent, or Firm* — Patterson & Sheridan, LLP

(57) ABSTRACT

A method of fabricating a printed circuit board having a coaxial via is disclosed. The method includes assembling a plurality of layers configured in a stack so that the plurality of layers has a top signal layer and a bottom signal layer; forming a hollow via through the plurality of layers to connect GND layers in the printed circuit board, forming or inserting into the hollow via a conductor coated with non-conductive material, covering the top layer and bottom layer with dielectric and patterned signal layers, covering the top layer and bottom layer with a masking agent, plating the top layer and bottom layer with a conductive material that connects signal traces within via, and removing the masking agent from the top layer and bottom layer.

11 Claims, 7 Drawing Sheets

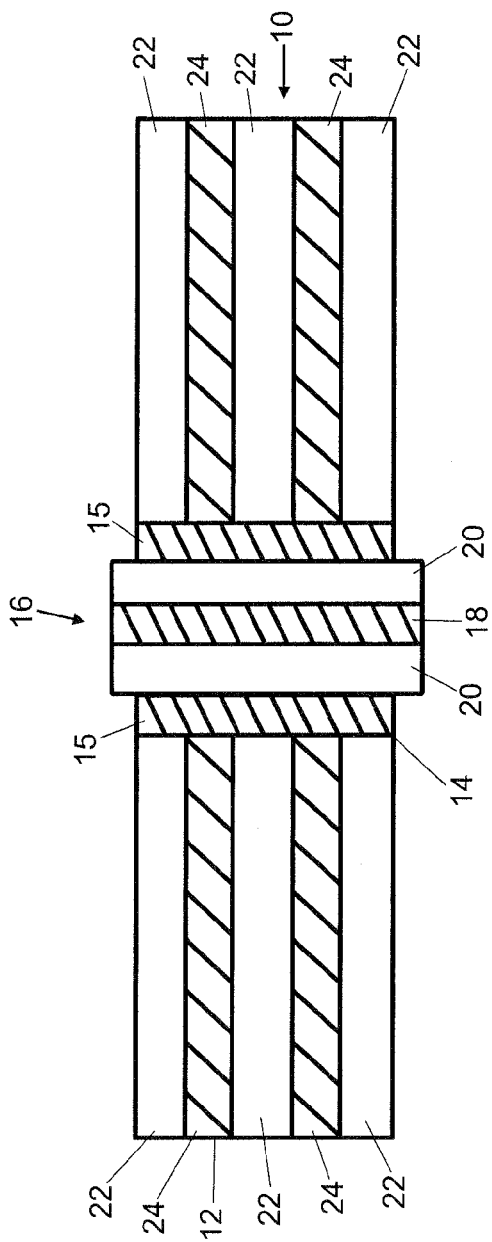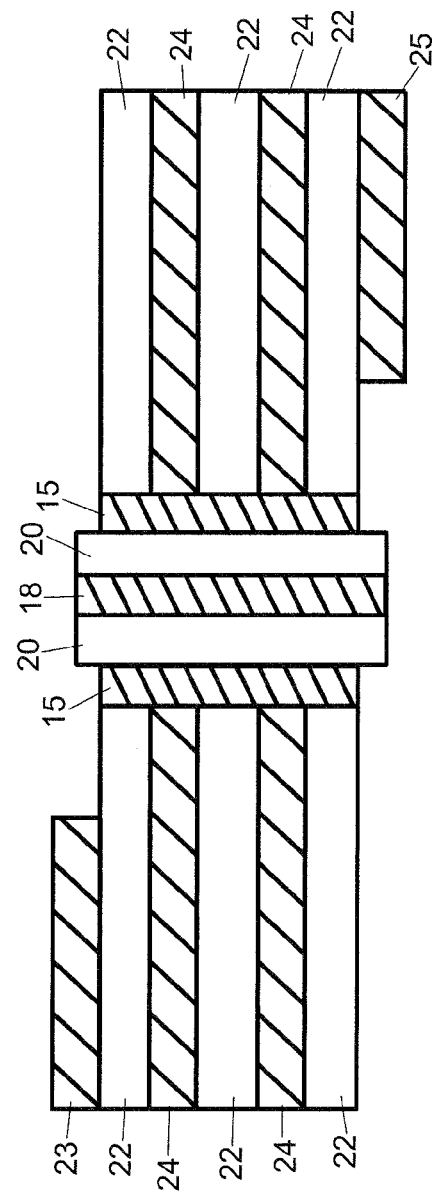

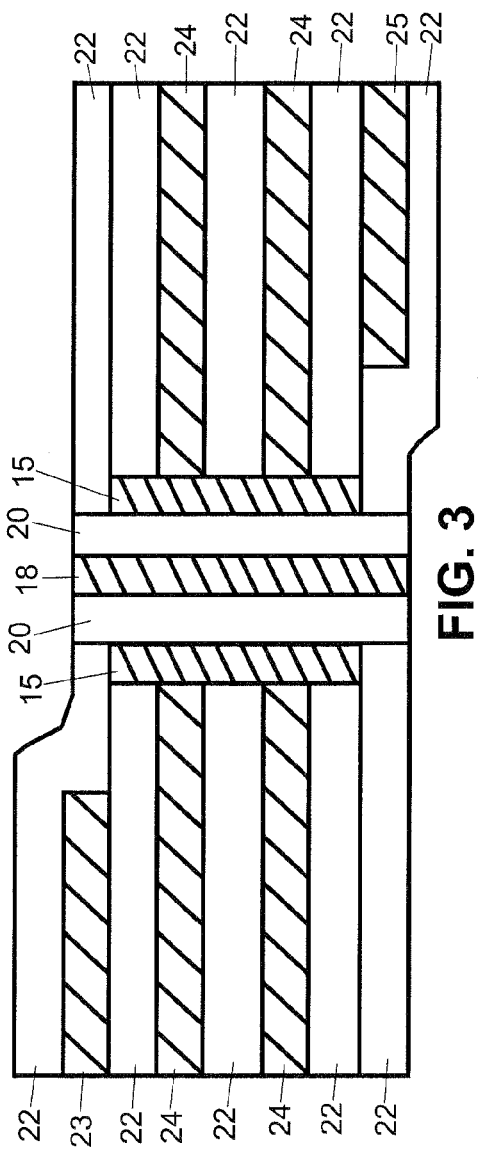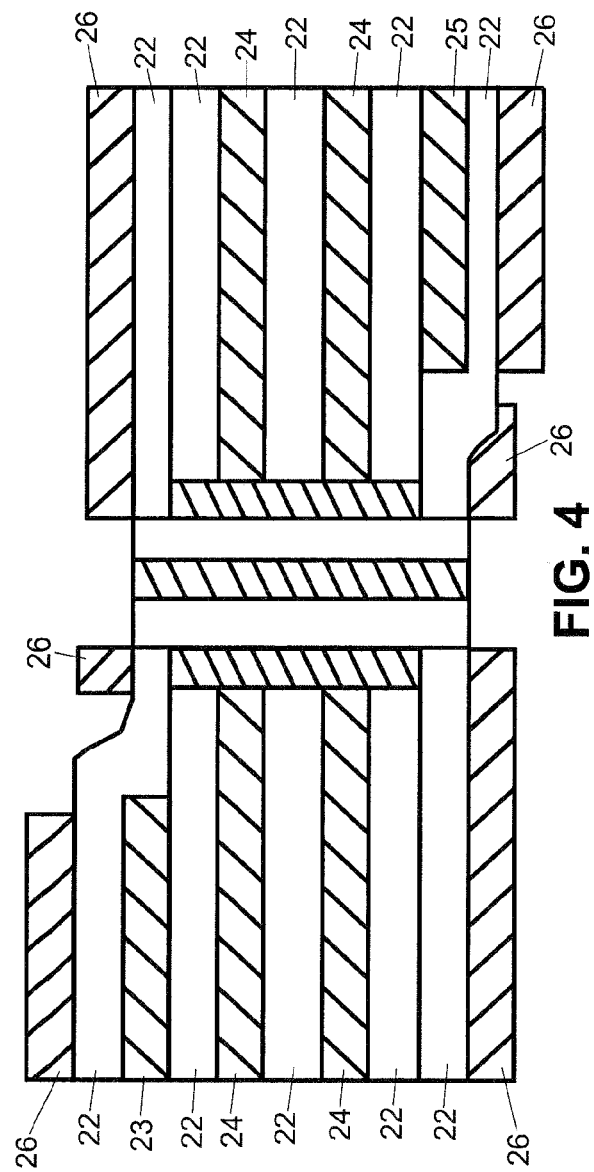

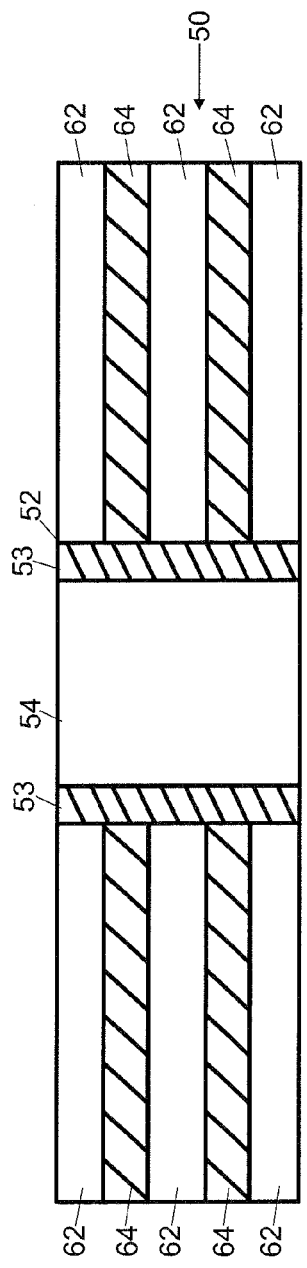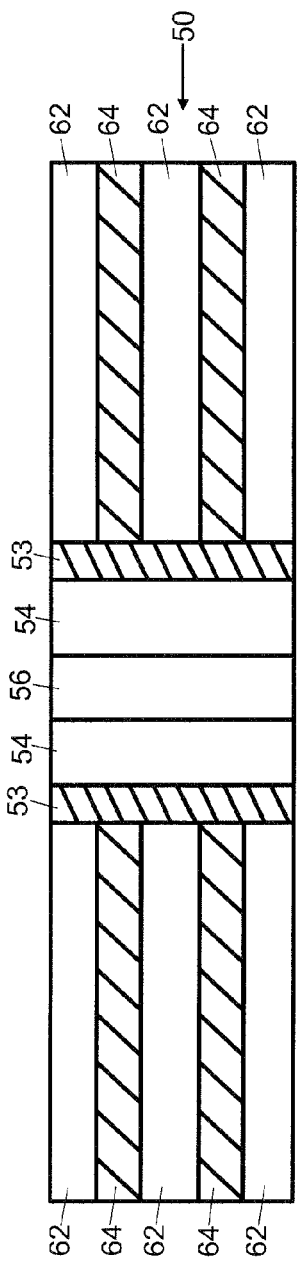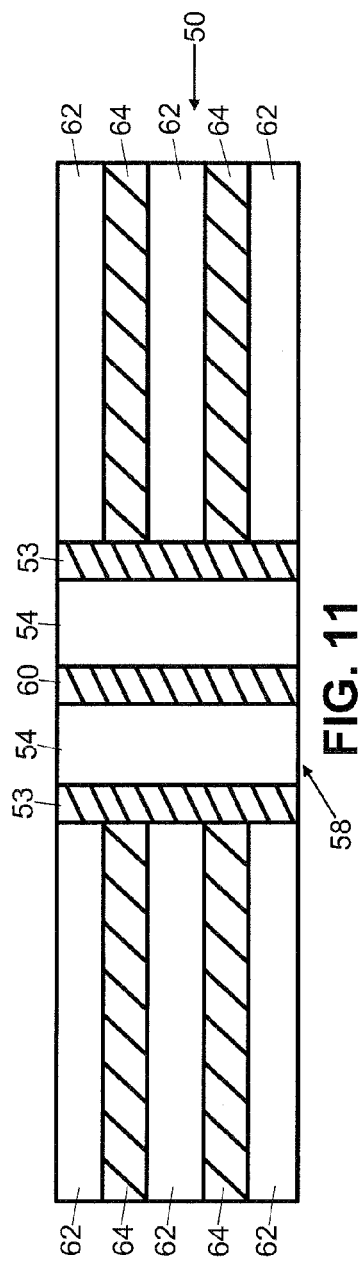

METHOD FOR FABRICATING A PRINTED CIRCUIT BOARD HAVING A COAXIAL VIA

CROSS-REFERENCE TO RELATED APPLICATIONS

This application is a divisional of co-pending U.S. patent application Ser. No. 11/292/536, filed Dec. 2, 2005, the entirety of which is incorporated by reference as if set forth herein.

FIELD

The present invention relates broadly to PCB assembly, and, more specifically, to configuring a coaxial via through stacked layers of a PCB.

BACKGROUND OF THE INVENTION

Printed circuit boards (PCBs) are typically constructed from two or more layers sandwiched together but separated by dielectric material. Layers can have different thicknesses and different dielectric material can be used within a PCB. Routing or other kinds of copper structures can be implemented at all layers. The outermost layers (top and bottom) of the PCB can have components mounted on their outside surfaces. Multilayer PCBs provide an important advantage over single layer structures in that a multilayer PCB has more routing space in a smaller footprint, which is useful for today's design imperative of smaller-size components.

Vias interconnect traces on different PCB layers and connect layers to power and/or ground planes. The physical properties of a via are dictated by board geometry and available space, and also by application. For example, in high-speed signaling applications, impedance-matched transitions are required between layers, particularly as frequencies in the Gigahertz range are utilized on the PCB.

In high-speed signaling designs, impedance continuity is essential for all of the interconnect elements including traces, connectors, cables and the like. Among all of these interconnect elements, the via presents the greatest obstacle to achieving impedance control, because traditional PCB process flow does not allow fabrication of coxial vias. Coaxial via technology is greatly needed for high-frequency applications as it would enable true signal impedance continuity, provide an excellent return path for ground (GND), and efficiently reduce via-to-via crosstalk and via-to-trace crosstalk.

One prior approach has been to surround a signal via with multiple GND vias. With this approach, the return path and impedance control are greatly improved. However, the additional GND vias consume valuable space on the footprint of a multilayer PCB. To save space, another prior approach was to split the via into four pieces so that one pair serves as signal vias and the other pair serve as GND vias. Unfortunately, performance of this dissected-via approach is unacceptable. Thus, there remains a heartfelt need for improved impedance control and performance in vias configured in multilayer PCBs.

SUMMARY OF THE INVENTION

The present invention solves the problems described above by presenting a coaxial via in a multilayer PCB. In the present invention, the plated wall of the via serves as the ground return of the coaxial via. It also connects all of the ground layers within the PCB. In one aspect, the present invention provides a method of fabricating a printed circuit board (PCB) having a coaxial via. First assembled is a stack of layers having a top signal layer and a bottom signal layer. A hollow via is formed through the stack to connect all of the GND layers, and a conductor coated with non-conductive material is inserted in the via. The top layer and bottom layer are first covered with dielectric and patterned signal layers, and then with a masking agent. In an embodiment, the masking agent is photoresist. The top layer and bottom layer are then plated with conductive material to connect signal traces within the via, and the masking agent is removed from the top layer and bottom layer. In an embodiment, multiple printed circuit board layers can be fabricated using this method and then laminated together in a stacked configuration, with each printed circuit board layer in the stacked configuration having its via disposed such that it aligns with a via on a neighboring printed circuit board in the stacked configuration.

In another aspect, the present invention provides a method of fabricating a printed circuit board having a via, comprising assembling a plurality of layers configured in a stack so that the plurality of layers has a top layer and a bottom layer. A hollow via is formed through the plurality of layers and filled with dielectric material. A hole is formed through the dielectric material to form an aperture that connects the top layer and the bottom layer. Provided within the aperture, either by insertion or by forming it in place, is a conductor coated with non-conductive material. The top signal layer 23 and bottom signal layer 25 are covered with dielectric and patterned signal layers, then covered with a masking agent. The top layer and bottom layer are then plated with a conductive material that connects signal traces within via and the masking agent is removed from the top layer and bottom layer. In an embodiment, multiple printed circuit board layers can be fabricated using this method and then laminated together in a stacked configuration, with each printed circuit board layer in the stacked configuration having its via disposed in it such that it aligns with a via on a neighboring printed circuit board in the stacked configuration.

Other features and advantages of the present invention will be apparent from the following detailed description, when considered in conjunction with the accompanying drawings, in which:

BRIEF DESCRIPTION OF THE DRAWINGS

FIG. 1 illustrates a multi-layer PCB having an aperture formed therein that accommodates a coaxial via.

FIG. 2 illustrates the multi-layer PCB of FIG. 1 covered with dielectric and patterned signal layers.

FIG. 3 illustrates the multi-layer PCB of FIG. 2 with additional dielectric layers added.

FIG. 4 illustrates the multi-layer PCB partially covered with a masking agent to define the dielectric layer to expose signal segments for plating.

FIG. 9 illustrates a multi-layer PCB having a via filled with dielectric material.

FIG. 10 illustrates the multi-layer PCB of FIG. 9 with an aperture formed within the via filled with dielectric material.

FIG. 11 illustrates the multi-layer PCB of FIG. 13 with a coaxial via inserted within the aperture formed in the dielectric material.

DETAILED DESCRIPTION

Figure 5:
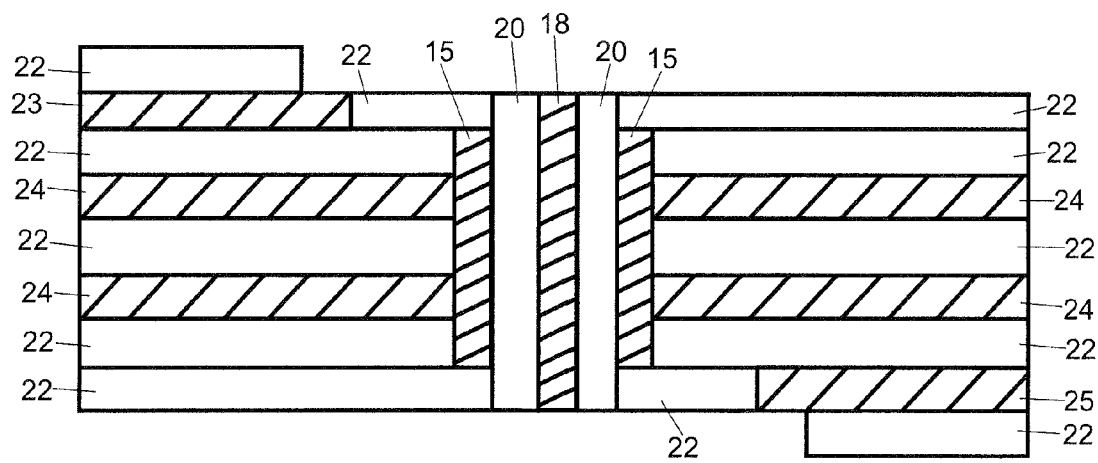
FIG. 5 illustrates the multi-layer PCB with of FIG. 4 with the masking agent removed.

FIGS. 1-13 illustrate cutaway views of multi-layer PCBs in various stages of completion in accordance with embodiments of the present invention. Dimensions of the PCB illustrated in FIGS. 1-13 in some cases have been exaggerated for clarity. Directing attention to FIG. 1, there is shown PCB 10, having a plurality of layers 12 arranged in a stack and having formed thereon an aperture that provides via 14. As illustrated, PCB 10 includes dielectric layers 22 and ground layers 24, but power layers can also be substituted for at least some of ground layers 24 in alternative embodiments. In an embodiment, via 14 has applied to its surface within the aperture a conductive coating material 15. Conductive coating material 15 serves as the ground return of the coaxial via. It also connects all of the GND layers 24 within PCB 10. Coaxial via 16 is inserted within via 14. Coaxial via 16 is illustrated with conductive member 18 surrounded by insulating layer 20. In FIG. 2, signal layers 23, 25 are added, and in FIG. 3 additional dielectric layers 22 are subsequently added. As shown in FIG. 4, masking material, such as photoresist, is applied to form masking layers 26 that define underlying dielectric layer 22 to expose signal segments for plating. Masking layers 26 are then removed, as shown in FIG. 5. In the preferred embodiment, photoresist is removed through known processes.

Figure 6:
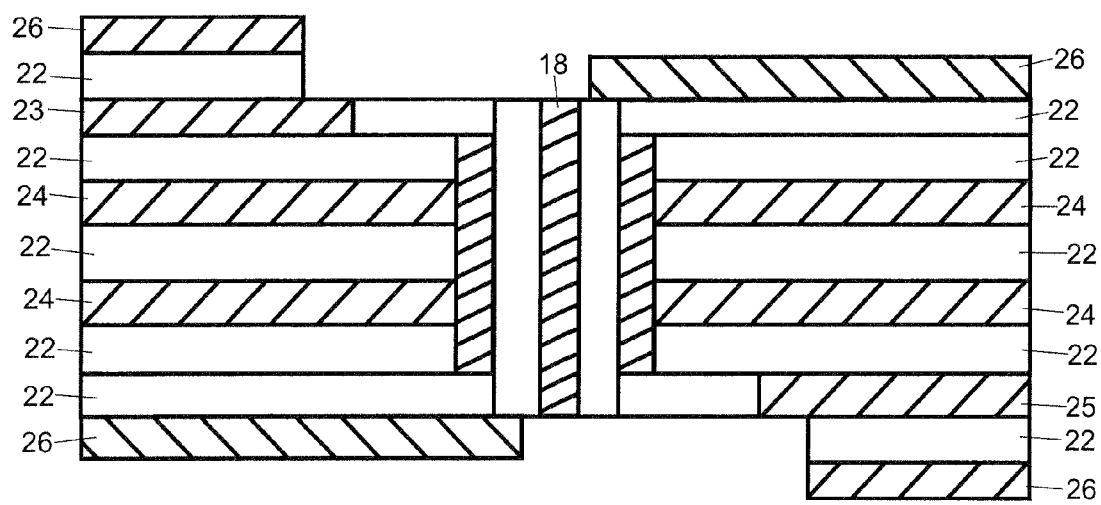
FIG. 6 illustrates the multi-layer PCB with masking layers applied to top and bottom surfaces for plating.
Figure 7:
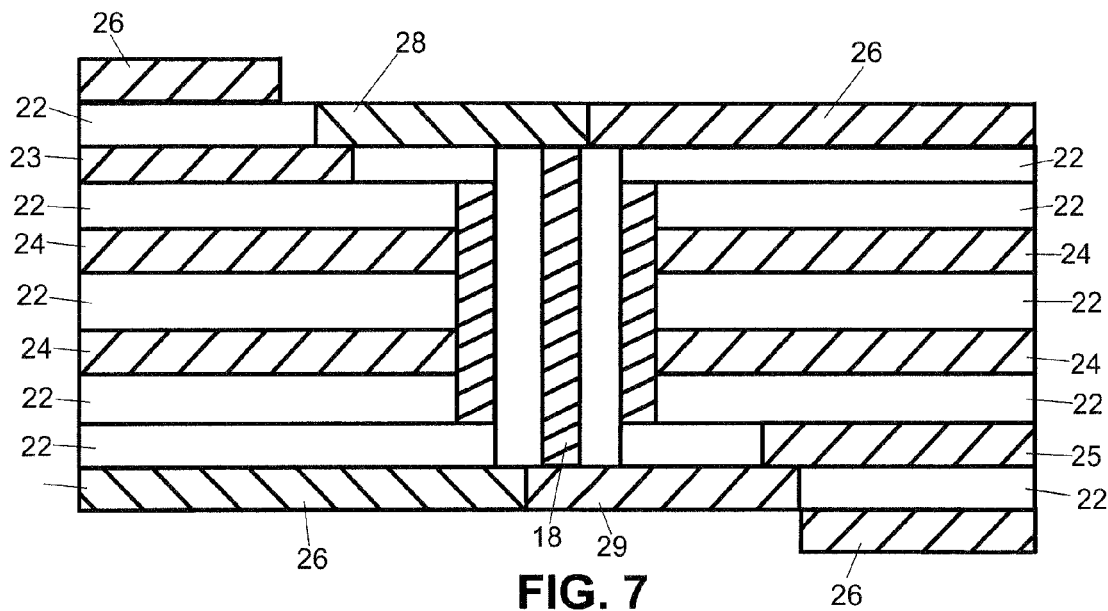
FIG. 7 illustrates the multi-layer PCB with plating layers applied to top and bottom surfaces.
Figure 8:
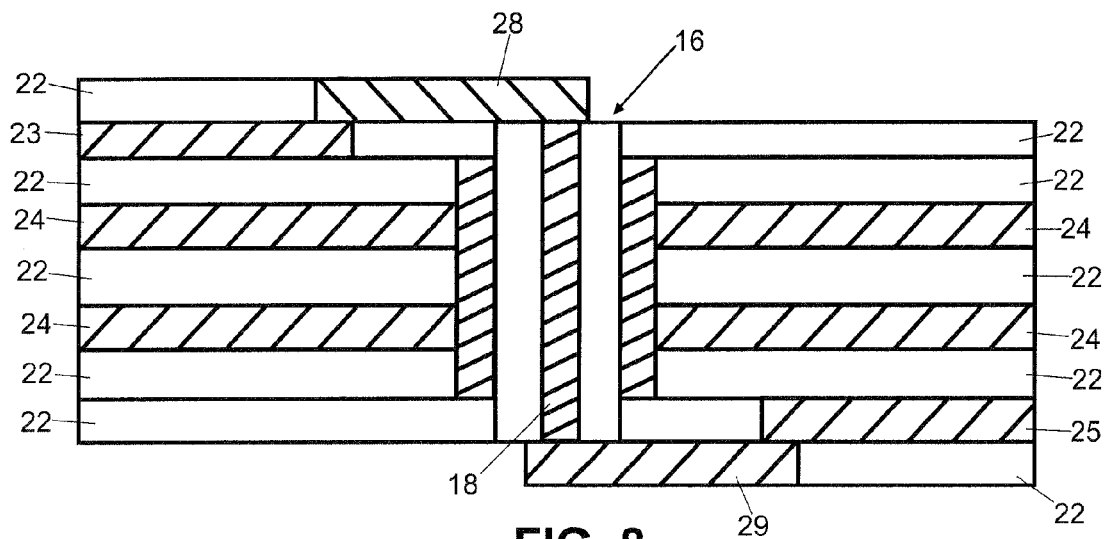
FIG. 8 illustrates the multi-layer PCB with masking layers removed.

Directing attention to FIG. 6, masking layers 26 are again applied to PCB 10's top and bottom surfaces. In FIG. 7, plating layers 28, 29 are added. After plating layers 28, 29 are added, the masking layers 26 are removed (as shown in FIG. 8), and PCB 10 has plating layers 28, 29 connected by coaxial via 16.

In another embodiment, the present invention provides a via filled with dielectric material formed within PCB. An aperture is formed within the dielectric material and a coaxial via is inserted in the aperture. Directing attention to FIG. 9, multi-layer PCB 50 is constructed from dielectric layers 62 and GND layers 64, and includes via 52 having applied to its surface conductive coating material 53. Via 52 is then filled with dielectric material 54. Aperture 56 is then formed through dielectric material 54, as shown in FIG. 10. Plating aperture 56 with conductive material 60 completes coaxial via 58, having conductive member 60, dielectric layer 54 and shield layer 53, as shown in FIG. 11. PCB 50 is then processed as described above with reference to FIGS. 2-5. First, dielectric layers are applied to the top and bottom surfaces of PCB 50. Signal layers are applied after the dielectric layers are applied. PCB 50 is then prepared for plating, by adding masking material to the top and bottom surfaces of PCB 50. PCB 50 is then plated on both top and bottom surfaces, and the masking material is removed. In the preferred embodiment, the masking material is photoresist, and its removal is performed using known methods.

Photoresist may be applied using a variety of techniques including dipping PCB 10, 50 in photoresist solution, or spraying, brushing or rollercoating the solution on the desired surface. Following the application of photoresist, excess solvents can be baked out of PCB 10, 50 using known techniques, such as subjecting PCB 10, 50 to a circulating current of hot air or heat produced by an infrared light or other radiating heat source focused on PCB 10, 50.

During the plating process contemplated by embodiments of the present invention, metal is applied to provide effective connection between the top surface and the bottom surface of PCB 10, 50, by completing a connection through the formed via and across coaxial via 16. The chosen metal should have a high electrical conductivity so high current is easily carried without voltage drops. There also should be good adherence of the chosen metal to the underlying surfaces of layers surrounding via 16.

Figure 12:
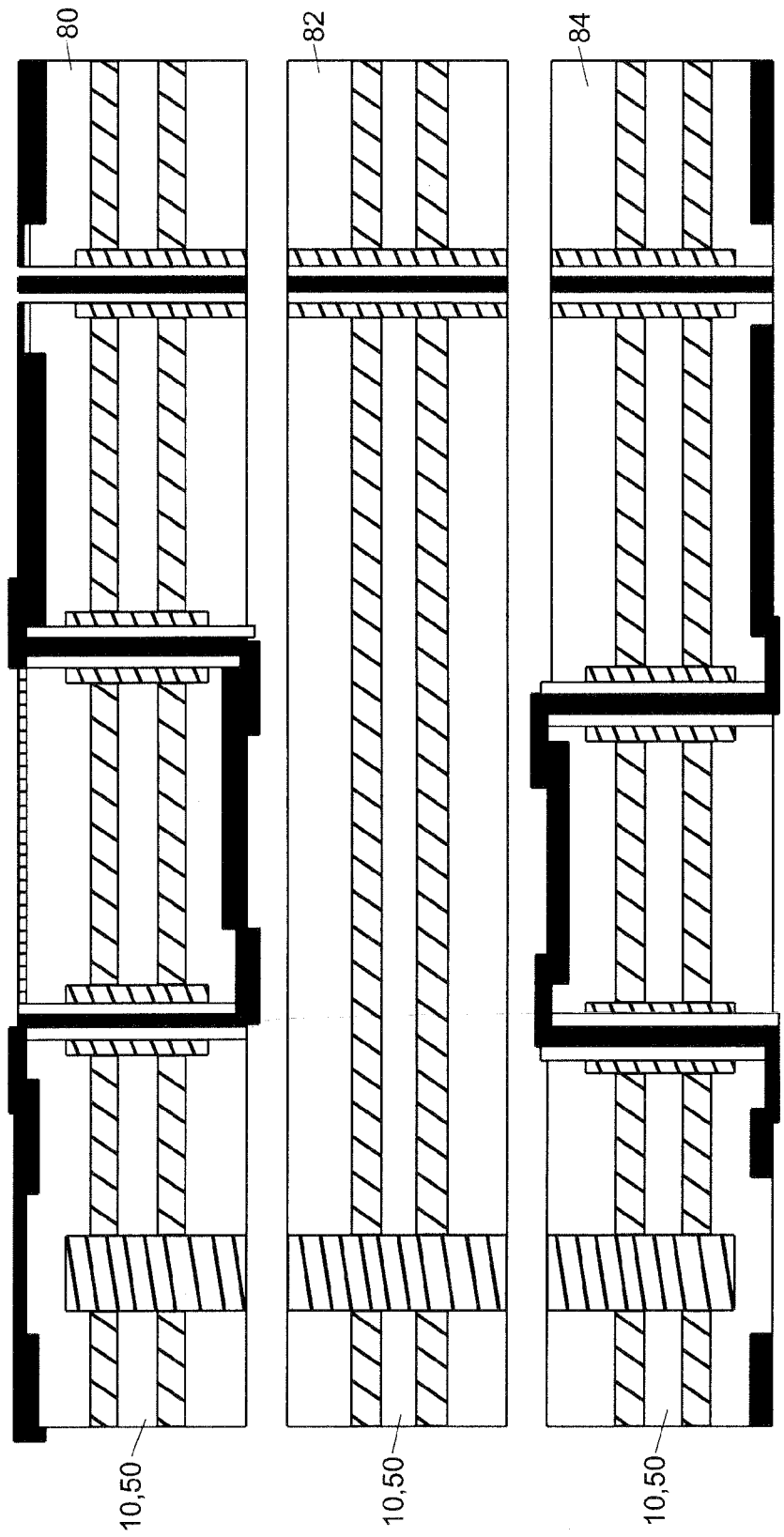
FIG. 12 illustrates a plurality of multi-layer PCBs before they are assembled together in a stack.
Figure 13:
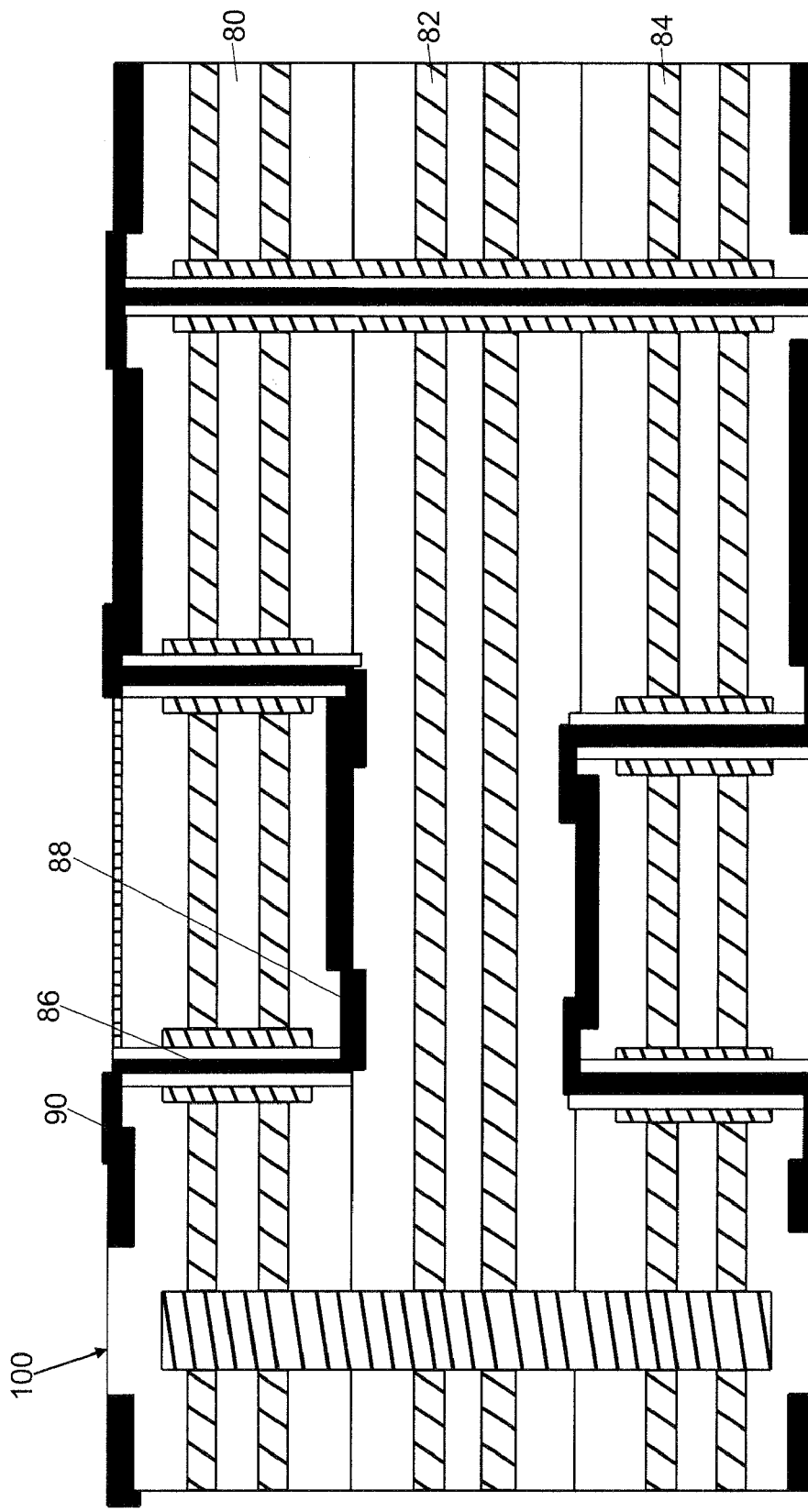
FIG. 13 illustrates the multi-layer PCBs of FIG. 12 after they are assembled together in a stack.

Directing attention to FIGS. 12 and 13, embodiments of the present invention assemble multiple PCBs 10, 50 into a single, multi-layer PCB 100 through sequential lamination of PCB layers 80, 82, 84. In this manner, via 86 connects at least one interior layer 88 with another layer 90 in a multi-layer PCB, as is useful for half-blind vias. While the dimensions of PCB layers 80, 82, 84 are exaggerated in FIGS. 12 and 13 for clarity, it is to be understood that actual thicknesses of metal layers do not interfere with lamination of PCB layers 80, 82, 84 in FIG. 12 into multi-layer PCB 100. It is also to be understood that, while three PCB layers are illustrated in FIG. 12, additional PCB layers can be included in the construction of multi-layer PCB 100. Various adhesives as are used in the lamination of existing PCB boards can be used in the lamination of PCB layers 80, 82, 84. Furthermore, while PCB layers 80, 82, 84 all contain ground and/or power layers. In an embodiment, some layers that do not have power or ground layers but have the coaxial via of the present invention can be included in the final assembly.

PCBs 10, 50, 100 may contain etched conductors attached to a sheet of insulator. The conductive etched conductors are also referred to as traces or tracks. The insulator is referred to as the substrate. In accordance with various embodiments of the present invention, PCB 10, 50 can be constructed using a variety of methods. Construction of PCBs 10, 50, 100 can incorporate etch-resistant inks to protect the copper foil on the outer surfaces or component surfaces of multi-component stacked embodiments of the present invention. Subsequent etching removes unwanted copper. Alternatively, the ink may be conductive, printed on a blank (non-conductive) board in embodiments involving hybrid circuit applications. Construction of PCBs 10, 50, 100 can also incorporate a photomask and chemical etching to remove the copper foil from the substrate, as described above. PCBs 10, 50, 100 can also be constructed using a 2- or 3-axis mechanical milling system to mill away the copper foil from the substrate.

In accordance with embodiments of the present invention, PCBs 10, 50, 100 can incorporate substrates made from paper impregnated with phenolic resin, sometimes branded Pertinax™. In other embodiments, substrates are constructed from a material designated FR-4. In yet other embodiments, substrates are constructed from plastics with low dielectric constant (permittivity) and dissipation factor, such as Rogers® 4000, Rogers® Duroid, DuPont® Teflon® (types GT and GX) brand products, polyimide, polystyrene and cross-linked polystyrene. For applications where a flexible PCB is useful, PCBs 10,50, 100 can incorporate substrates constructed from DuPont's® Kapton® brand polyimide film, and others.

PCBs 10, 50, 100 can also incorporate a conformal coat that is applied by dipping or spraying after components on PCB 10, 50 have been soldered. The conformal coats be dilute solutions of silicone rubber or epoxy, or plastics sputtered onto PCBs 10, 50, 100 in a vacuum chamber.

While the preferred embodiments of the present invention have been illustrated and described in detail, it is to be understood that numerous modifications can be made to embodiments of the present invention without departing from the spirit thereof.

What is claimed is:

1. A printed circuit board, comprising:
   a plurality of layers configured in a stack so that the plurality of layers has a top layer and a bottom layer and at least one conductive layer;
   a hollow via extending through at least one of the plurality of layers;
   within the hollow via, a conductive material applied to a surface defining the hollow via, and a conductor coated with non-conductive material;
   wherein the top layer and bottom layer are covered by dielectric layers and the top layer and bottom layer are plated with a conductive material; and
   wherein the hollow via is a blind via, such that the conductor of the hollow via connects two of the plurality of layers, at least one of which is an interior layer, while the other layer of the two layers is one of the top layer and the bottom layer, while the conductor of the hollow via does not connect the conductive material on the top layer to the conductive material on the bottom layer.

2. The printed circuit board of claim 1, wherein the at least one conductive layer comprises at least one ground layer.

3. The printed circuit board of claim 1, wherein the at least one conductive layer comprises at least one power layer.

4. A printed circuit board, comprising:
   a plurality of printed circuit board layers laminated together in a stacked configuration to form a single printed circuit board, wherein each printed circuit board layer in laminated stacked configuration comprises a plurality of layers configured in a stack so that the plurality of layers has a top layer and a bottom layer and at least one conductive layer;
   a plurality of hollow vias formed through the plurality of layers, the hollow vias having a defining surface, the defining surface having a conductive material applied thereon, the conductive material connecting to the at least one conductive layer;
   within each hollow via, a conductor coated with non-conductive material;
   wherein the top layer and bottom layer are covered by dielectric layers and the top layer and bottom layer are plated with a conductive material, the conductive material on the top layer being connected to the conductive material on the bottom layer by the conductor located within at least one of the plurality of hollow vias such that the at least one hollow via in each printed circuit board is disposed within its printed circuit board layer such that it aligns with the at least one hollow via on a neighboring printed circuit board layer within the printed circuit board layers laminated together in the stacked configuration; and
   wherein at least one other of the plurality of hollow vias is a blind via, such that the conductor of the at least one other hollow via connects two of the plurality of layers, at least one of which is an interior layer, while the other layer of the two layers is one of the top layer and the bottom layer, while the conductor of the at least one other hollow via does not connect the conductive material on the top layer to the conductive material on the bottom layer.

5. The printed circuit board of claim 4, wherein the at least one conductive layer comprises at least one ground layer.

6. The printed circuit board of claim 4, wherein the at least one conductive layer comprises at least one power layer.

7. The printed circuit board of claim 4, wherein the conductor of the at least one other hollow via connects the interior layer to one of the conductive material on the top layer or the conductive material on the bottom layer of the stacked configuration.

8. A printed circuit board, comprising:
   a plurality of layers configured in a stack so that the plurality of layers has a top layer and a bottom layer and at least one conductive layer;
   a first via disposed through at least one of the plurality of layers, wherein the first via has applied to its inner surface a conductive material, the conductive material connecting to the at least one conductive layer, wherein the first via is filled with dielectric material, the dielectric material having an aperture; and a conductor disposed within the aperture of the dielectric material; and
   a second via disposed through at least one of the plurality of layers, wherein the second via has a conductive material applied to its inner surface, the conductive material connecting to the at least one conductive layer, wherein the second via is filled with dielectric material, the dielectric material having an aperture and a conductor disposed within the aperture of the dielectric material; wherein
   the top layer and bottom layer comprise dielectric layers and are plated with a conductive material;
   the conductor located within the first via connects an interior layer of the plurality of layers to the conductive material on one of the top or bottom layers;
   the conductor located within the second via connects another interior layer to the conductive material on the one of the top or bottom layers; and
   neither the conductor located within the first via nor the conductor located within the second via, connects the conductive material on the top layer to the conductive material on the bottom layer.

9. The printed circuit board of claim 8, wherein the at least one conductive layer comprises at least one ground layer.

10. The printed circuit board of claim 8, wherein the at least one conductive layer comprises at least one power layer.

11. The printed circuit board of claim 8, further comprising:
    a third via disposed through the plurality of layers, wherein the third via has applied to its inner surface a conductive material, the conductive material connecting to the at least one conductive layer, wherein the third via is filled with dielectric material, the dielectric material having an aperture and a conductor disposed within the aperture of the dielectric material; wherein
    the conductor of the third via connects the conductive material on the top layer to the conductive material on the bottom layer.

* * * * *

UNITED STATES PATENT AND TRADEMARK OFFICE
CERTIFICATE OF CORRECTION

| | | |
|---|---|---|
| PATENT NO. | : 8,035,038 B2 | Page 1 of 1 |
| APPLICATION NO. | : 12/101426 | |
| DATED | : October 11, 2011 | |
| INVENTOR(S) | : Cheng et al. | |

It is certified that error appears in the above-identified patent and that said Letters Patent is hereby corrected as shown below:

Column 1, Line 43, please delete "coxial" and insert --coaxial-- therefor.

Signed and Sealed this
Tenth Day of January, 2012

David J. Kappos
*Director of the United States Patent and Trademark Office*